(12) United States Patent
Lemke et al.

(10) Patent No.: US 8,120,926 B2
(45) Date of Patent: Feb. 21, 2012

(54) INTERCONNECTION ASSEMBLY FOR PRINTED CIRCUIT BOARDS

(75) Inventors: Timothy A. Lemke, Dillsburg, PA (US); Charles C. Byer, Palo Alto, CA (US)

(73) Assignee: Z-Plane, Inc., Palo Alto, CA (US)

( * ) Notice: Subject to any disclaimer, the term of this patent is extended or adjusted under 35 U.S.C. 154(b) by 560 days.

(21) Appl. No.: 12/275,051

(22) Filed: Nov. 20, 2008

(65) Prior Publication Data

US 2009/0201658 A1    Aug. 13, 2009

Related U.S. Application Data

(60) Provisional application No. 61/065,136, filed on Feb. 11, 2008.

(51) Int. Cl.
*H05K 1/14*    (2006.01)

(52) U.S. Cl. ........................................... 361/788

(58) Field of Classification Search .................... 361/788
See application file for complete search history.

(56) References Cited

U.S. PATENT DOCUMENTS

| | | | |
|---|---|---|---|
| 3,872,236 A | 3/1975 | Swengel, Sr. et al. | |
| 3,963,301 A | 6/1976 | Stark | |
| 3,969,816 A | 7/1976 | Swengel, Sr. et al. | |
| 4,558,916 A | 12/1985 | Hehl | |
| RE32,691 E | 6/1988 | Dola et al. | |
| 4,835,394 A | 5/1989 | Steele | |
| 5,008,484 A | 4/1991 | Wagener | |
| 5,116,239 A | 5/1992 | Siwinski | |
| 5,245,613 A | 9/1993 | Takami et al. | |
| 5,278,524 A | 1/1994 | Mullen | |
| 5,430,615 A * | 7/1995 | Keeth et al. | 361/788 |
| 5,652,697 A * | 7/1997 | Le | 361/788 |

(Continued)

FOREIGN PATENT DOCUMENTS

WO    WO 03034636 A2 *    4/2003

(Continued)

OTHER PUBLICATIONS

PCT, International Search Report, mailed Mar. 20, 2009, for related international application No. PCT/US2009/000748.

(Continued)

*Primary Examiner* — Lisa Lea Edmonds
(74) *Attorney, Agent, or Firm* — Jones Day (57) ABSTRACT

A backplane has through holes for conductors to project through the backplane in arrays corresponding to respective circuit boards arranged along the front side of the backplane. The through holes include ground holes for receiving ground conductors in connection with a ground plane, and signal holes for receiving signal conductors free of connections with the ground plane. In accordance with a principal feature, the backplane is free of circuitry configured to interconnect signal conductors in the signal holes. This avoids problems associated with circuit density within the structure of a backplane. In accordance with another principal feature, each signal hole is wide enough to provide clearance for a respective signal conductor to extend fully through the signal hole free of contact with the backplane. The clearance contains air that serves as a dielectric to increase the impedance between adjacent signal holes, and thereby to reduce crosstalk and other problems associated with close proximity between signal holes. Additional through holes provide additional impedance at locations between adjacent conductor through holes. Such additional through holes for impedance control can be included in the circuit boards as well as the backplane.

29 Claims, 14 Drawing Sheets

U.S. PATENT DOCUMENTS

| | | | |
|---|---|---|---|
| 5,971,804 | A | 10/1999 | Gallagher et al. |
| 6,019,609 | A | 2/2000 | Strange |
| 6,091,609 | A * | 7/2000 | Hutson et al. ............... 361/794 |
| 6,163,464 | A * | 12/2000 | Ishibashi et al. ............ 361/788 |
| 6,287,132 | B1 | 9/2001 | Perino et al. |
| 6,300,847 | B1 | 10/2001 | Gallagher et al. |
| 6,322,370 | B1 | 11/2001 | Hart et al. |
| 6,364,713 | B1 | 4/2002 | Kuo |
| 6,717,825 | B2 * | 4/2004 | Volstorf ..................... 361/803 |
| 6,822,876 | B2 * | 11/2004 | Goergen ..................... 361/788 |
| 7,038,918 | B2 * | 5/2006 | AbuGhazaleh et al. ...... 361/780 |
| 7,042,735 | B2 * | 5/2006 | Koga et al. .................. 361/788 |
| 7,139,177 | B2 * | 11/2006 | Gottlieb ..................... 361/788 |
| 7,239,526 | B1 * | 7/2007 | Bibee ......................... 361/788 |
| 7,239,527 | B1 * | 7/2007 | Goergen ..................... 361/788 |
| 7,362,590 | B2 * | 4/2008 | Coffey et al. ............... 361/788 |
| 7,405,947 | B1 * | 7/2008 | Goergen ..................... 361/788 |
| 7,463,831 | B2 * | 12/2008 | Wang et al. ................. 398/164 |
| 7,468,894 | B2 * | 12/2008 | Bibee ......................... 361/788 |
| 7,570,487 | B2 * | 8/2009 | Clark et al. ................. 361/715 |
| 7,602,617 | B2 * | 10/2009 | Brandt et al. ............... 361/788 |
| 7,654,870 | B2 * | 2/2010 | Lemke ........................ 439/636 |
| 7,927,149 | B2 * | 4/2011 | Lemke ........................ 439/636 |
| 2002/0125967 | A1 | 9/2002 | Garrett et al. |
| 2003/0112091 | A1 | 6/2003 | Lemke et al. |
| 2005/0219830 | A1 * | 10/2005 | Coffey et al. ............... 361/788 |
| 2006/0158864 | A1 * | 7/2006 | Gay ............................ 361/785 |
| 2006/0256540 | A1 * | 11/2006 | AbuGhazaleh et al. ...... 361/788 |
| 2007/0025094 | A1 * | 2/2007 | Fischer et al. .............. 361/788 |
| 2007/0124930 | A1 * | 6/2007 | Cheng et al. ................ 29/852 |
| 2007/0268087 | A9 | 11/2007 | Lemke et al. |
| 2008/0084680 | A1 * | 4/2008 | Islam et al. ................. 361/788 |
| 2009/0067146 | A1 * | 3/2009 | Huels et al. ................. 361/788 |

FOREIGN PATENT DOCUMENTS

| | | |
|---|---|---|
| WO | WO 03/092121 A2 | 11/2003 |
| WO | WO 03092121 A2 * | 11/2003 |

OTHER PUBLICATIONS

PCT, International Search Report, mailed Apr. 9, 2009, for corresponding international application No. PCT/US2009/000751.

* cited by examiner

INTERCONNECTION ASSEMBLY FOR PRINTED CIRCUIT BOARDS

RELATED APPLICATIONS

This application claims the benefit of provisional U.S. Patent Application 61/065,136, filed Feb. 11, 2008.

TECHNICAL FIELD

This technology relates to electrical connections between printed circuit boards installed against a backplane.

BACKGROUND

Printed circuit boards are typically interconnected through a backplane. The backplane may be located at the rear of a cabinet or other housing. The circuit boards are installed in the housing by sliding them into positions that are parallel to each other and perpendicular to the backplane, with their inner edges adjoining the backplane. Electrical connections for routing signals between the boards are formed in part by connectors that attach them to the backplane, and in part by circuitry within the backplane itself. The configuration of that circuitry is constrained by the area and thickness of the backplane. As a result, close proximity of interconnecting traces within the backplane can cause problems such as signal attenuation, signal reflection, crosstalk and noise.

SUMMARY

An apparatus interconnects circuit boards through ground conductors and signal conductors connected to the circuit boards. The apparatus includes a backplane having a front side, a rear side, and a ground plane. The backplane further has through holes for conductors to project through the backplane in arrays corresponding to respective circuit boards arranged along the front side of the backplane. The through holes include ground holes for receiving ground conductors in connection with the ground plane, and signal holes for receiving signal conductors free of connections with the ground plane.

In accordance with a principal feature of the invention, the backplane is free of circuitry configured to interconnect signal conductors in the signal holes. This avoids problems associated with circuit density confined within the structure of a backplane. In accordance with another principal feature of the invention, each signal hole is wide enough to provide clearance for a respective signal conductor to extend fully through the hole free of contact with the backplane. The clearance spaces contain air that serves as a dielectric to increase the impedance between conductors in adjacent signal holes, and thereby to reduce crosstalk and other problems associated with close proximity between signal holes. Additional impedance can be provided by additional through holes at locations between conductor through holes. Such additional through holes for impedance control can be included in the circuit boards as well as the backplane.

DETAILED DESCRIPTION

The apparatus shown in the drawings has parts that are examples of the elements recited in the claims. The following description thus includes examples of how a person of ordinary skill in the art can make and use the claimed invention. It is presented here to meet the statutory requirements of written description, enablement, and best mode without imposing limitations that are not recited in the claims.

Figure 1:
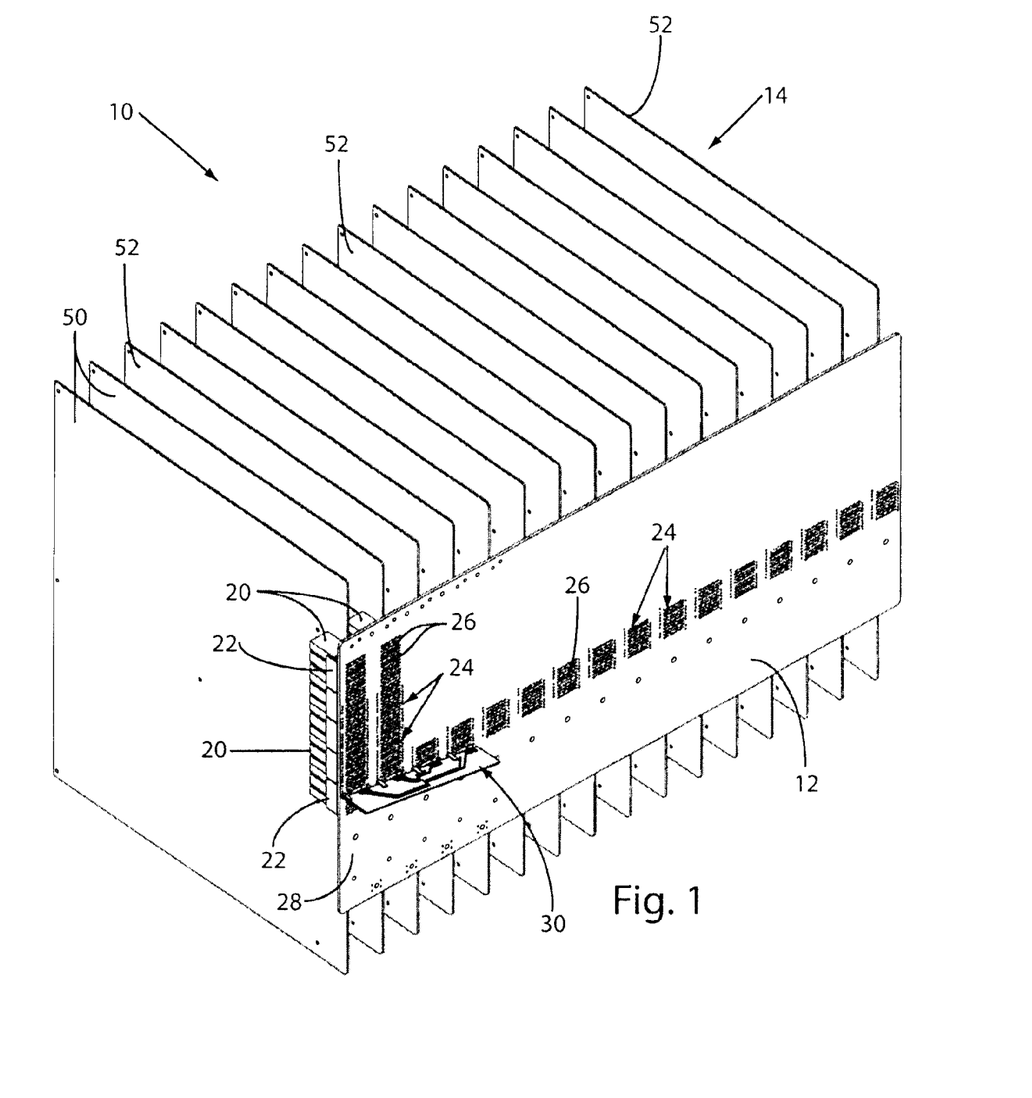
FIG. 1 is a rear perspective view of parts of a backplane assembly.
Figure 2:
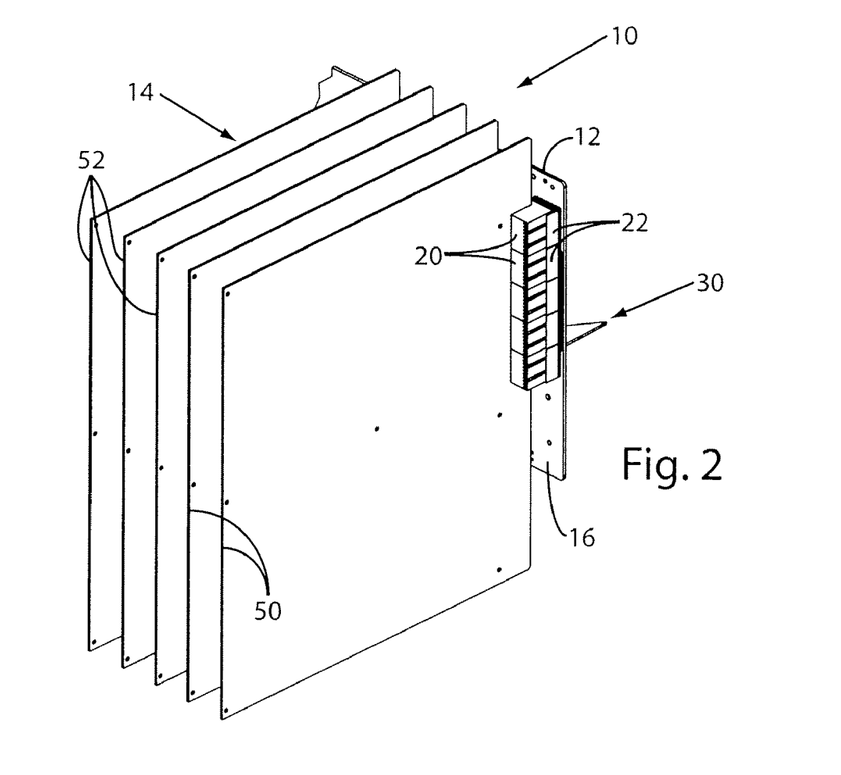
FIG. 2 is a front perspective view of parts shown in FIG. 1.

FIGS. 1 and 2 show parts of a backplane assembly 10, including a board configured as a backplane 12, and printed circuit boards configured as cards 14 arranged along the front side 16 of the backplane 12. Each card 14 has connectors 20 engaged with corresponding headers 22 that are mounted on the backplane 12. Each header 22 has an array 24 of conductors 26. The conductors 26 at each header 22 extend from the corresponding connector 20 through the backplane 12 to project from the rear side 28 of the backplane 12. A plurality of connector board assemblies 30, one of which is shown in FIG. 1, extend across the rear side 28 of the backplane 12 between separate arrays 24 of conductors 26. The connector board assemblies 30 have circuitry that interconnects the separate arrays 24 of conductors 26. This enables cards 14 at the front side 16 of the backplane 12 to be electrically interconnected independently of the backplane 12.

Figure 3:
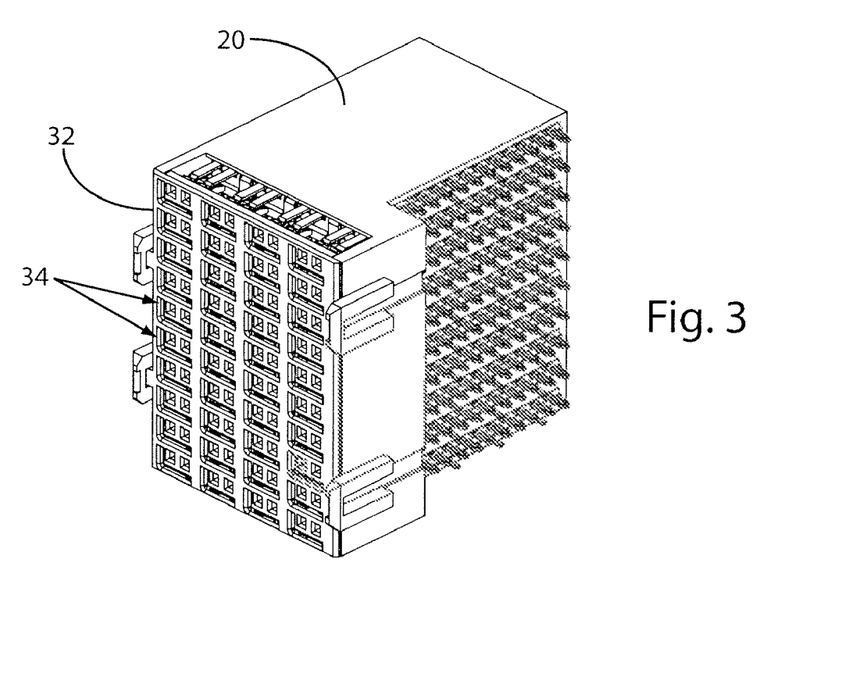
FIG. 3 is a rear perspective view of a part of the backplane assembly.
Figure 4:
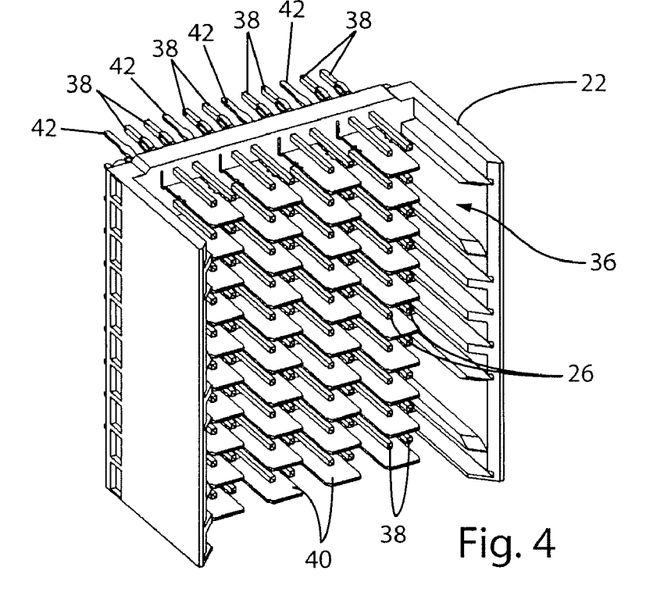
FIG. 4 is a front perspective view of a part of the backplane assembly.
Figure 5:
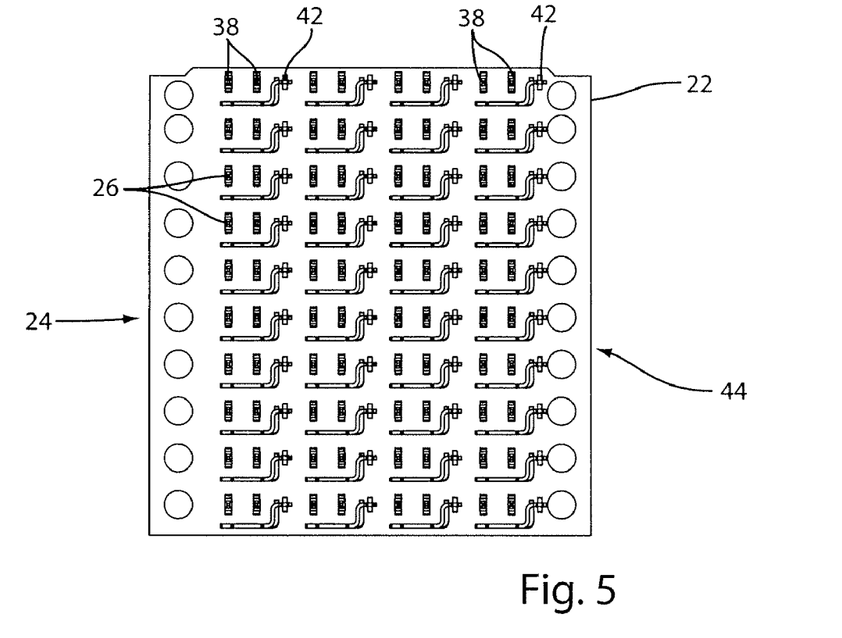
FIG. 5 is a rear perspective view of the part shown in FIG. 4.

As shown in FIG. 3, each connector 20 has a rear end 32 with receptacles 34. As shown in FIG. 4, each header 22 has a front side 36 from which the conductors 26 project into the receptacles 34 in the corresponding connector 20. The conductors 26 at the front side 36 of the header 22 include signal pins 38 and ground blades 40. The signal pins 38 are arranged in rows of eight. The ground blades 40 are arranged in rows of four. Each ground blade 40 at the front side 36 of the header 22 has an integral ground pin 42 at the rear side 44 (FIG. 5) of the header 22. The ground pins 42 are arranged within the rows of signal pins 38. In this arrangement, each row of conductors 26 at the rear side 44 of the header 22 includes eight signal pins 38 and four ground pins 42. The array 24 as a whole is orthogonal with ten rows of twelve conductors 26.

Figure 6:
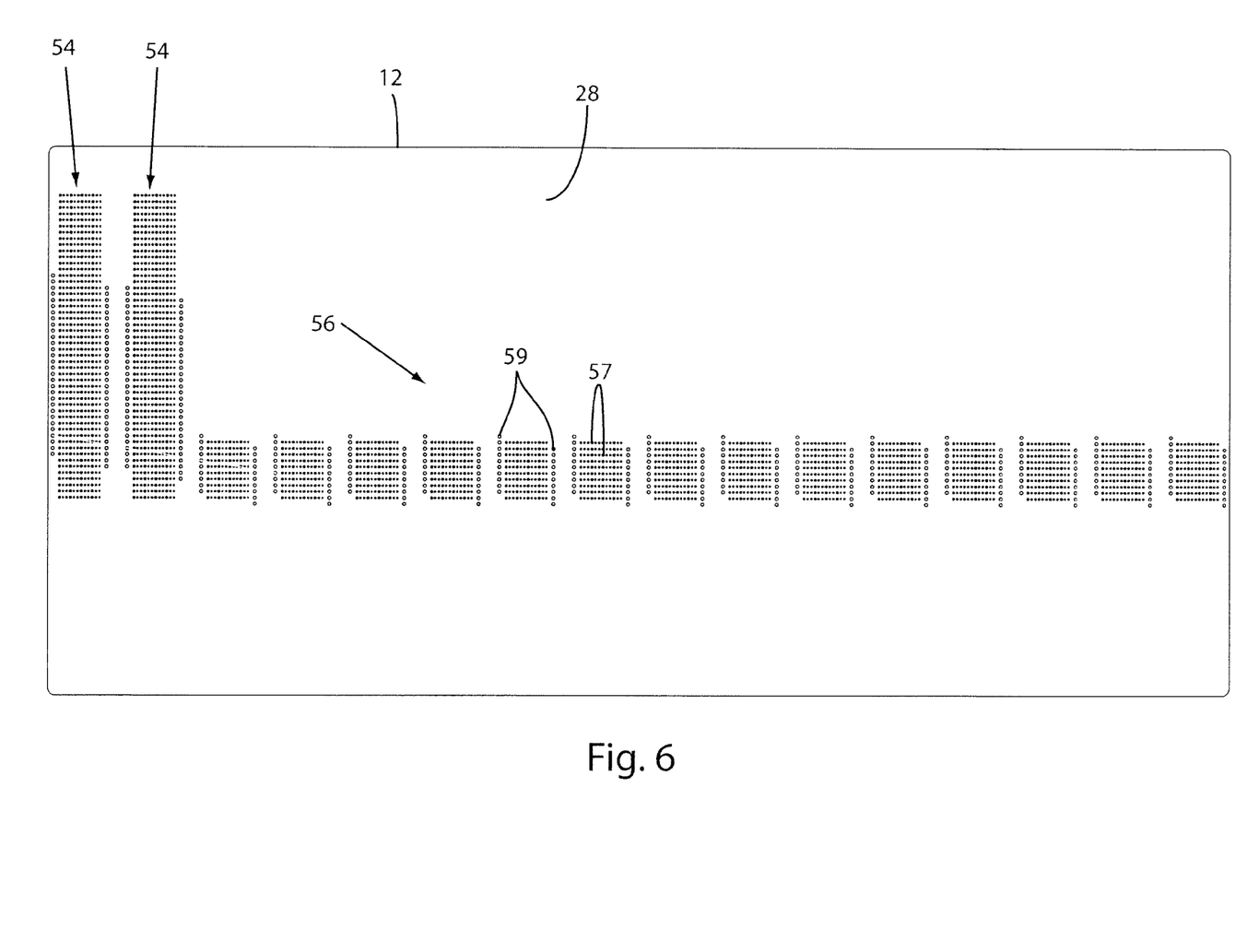
FIG. 6 is a rear view of a part of the backplane assembly.

The cards 14 in this example include a pair of hub cards 50 and a larger series of daughter cards 52. Each hub card 50 has multiple connectors 20 engaging corresponding headers 22 on the backplane 12. The arrays 24 of conductors 26 projecting from those headers 22 form two vertical columns at the rear side 28 of the backplane 12. Each daughter card 52 has only a single connector 20, and the backplane assembly 10 includes a single header 22 for each connector 20 on the daughter cards 52. The arrays 24 of conductors 26 projecting from those headers 22 form a single horizontal row across the rear side 28 of the backplane 12. As shown in FIG. 6, the backplane 12 in this example is configured for that particular arrangement, with two columns 54 and one row 56 of holes 57 for receiving the conductors 26.

More specifically, the holes 57 in each column 54 are arranged in an orthogonal array that encompasses the multiple arrays 24 of conductors 26 on the headers 22 for the corresponding hub card 50. The holes 57 in the horizontal row 56 are likewise arranged in orthogonal arrays, each of which matches the orthogonal array 24 of conductors 26 on the header 22 at the corresponding daughter card 52. Accordingly, each array of holes 57 in the horizontal row 56 includes ten rows of twelve holes 57. Columns of peg holes 59 for the connector board assemblies 30 (FIG. 1) are arranged in pairs that flank the arrays of conductor holes 57. The backplane 12 preferably does not include signal traces that interconnect any conductor hole 57 with any other conductor hole 57.

Figure 7:
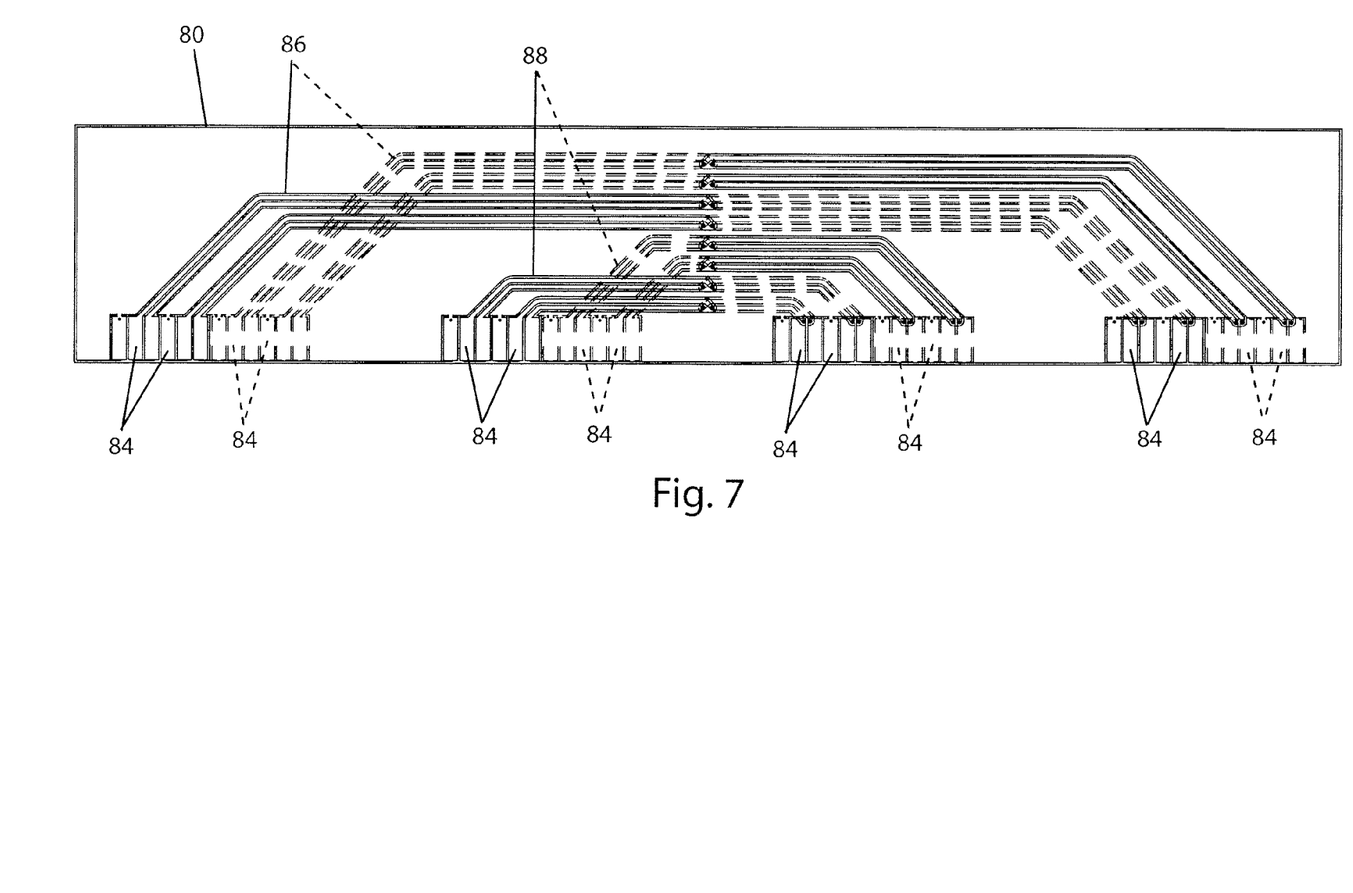
FIG. 7 is a top view of a part of the backplane assembly.
Figure 8:
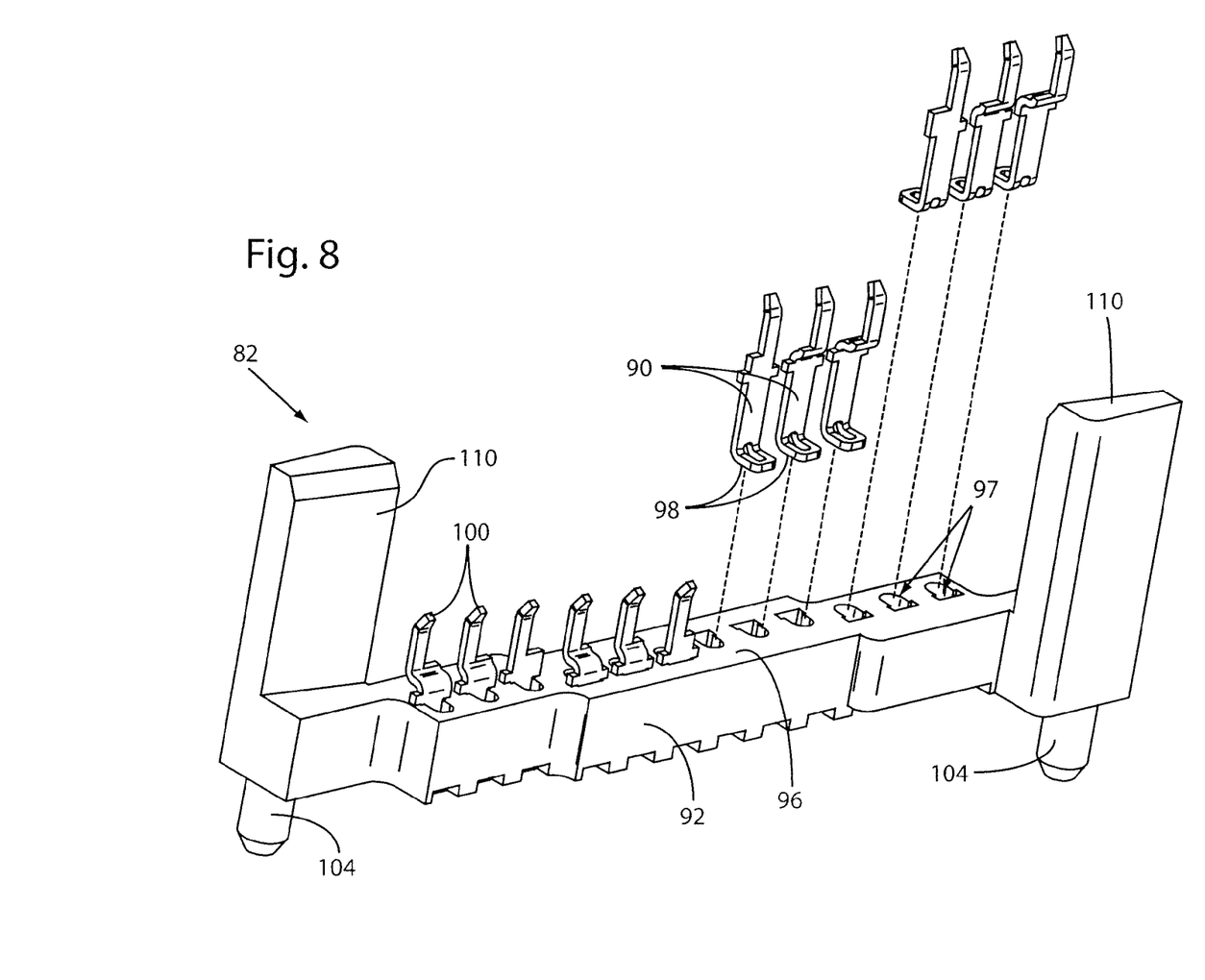
FIG. 8 is a perspective view of a part of the backplane assembly.
Figure 9:
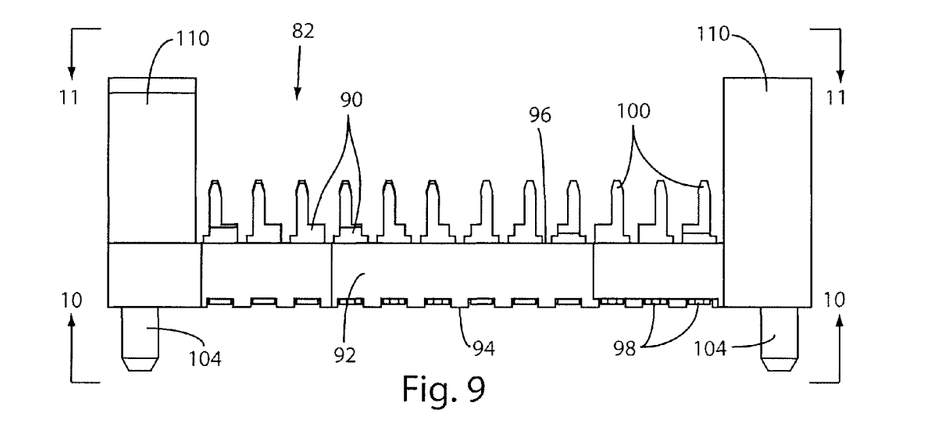
FIG. 9 is a top view of the part shown in FIG. 8.

The individual connector board assembly 30 of FIG. 1 includes a connector board and two pairs of adapters. As shown separately in FIG. 7, the connector board 80 is an elongated rectangular panel with four sets of electrical contacts 84 arranged along one long edge. Each set includes twelve contacts 84, with six of those contacts 84 on one side of the board 80 and the other six on the opposite side of the board 80. The structure of the board 80 includes signal traces 86 that interconnect the two sets of contacts 84 at the opposite ends of the board 80, as well as signal traces 88 that interconnect the two intermediate sets of contacts 84.

Figure 10:
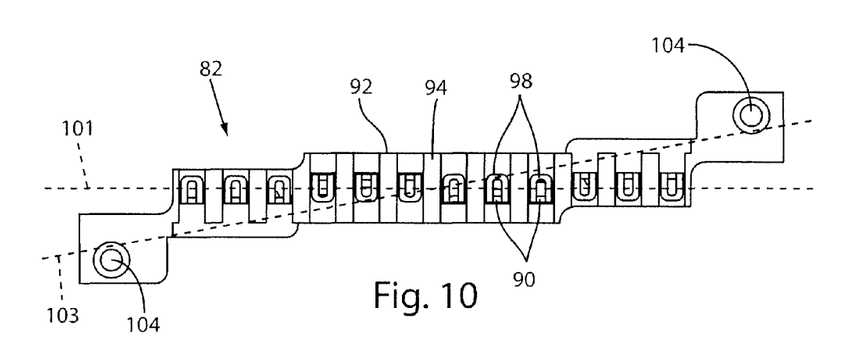
FIG. 10 is a view taken on line 10-10 of FIG. 9.
Figure 11:
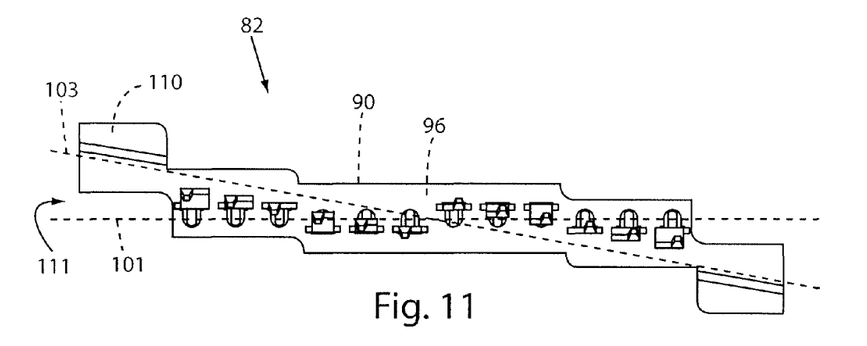
FIG. 11 is a view taken on line 11-11 of FIG. 9.

The adapters 82 are alike. As shown in FIGS. 8-11, each adapter 82 in the given example includes twelve electrical terminals 90 and a housing 92 for the terminals 90. The housing 92 is an elongated structure with front and rear sides 94 and 96. Passages 97 extend through the housing 92, and are arranged in a row along the length of the housing 92. The terminals 90 are installed in the passages 97, with their inner end portions 98 accessible at the front side 94 of the housing 92, and their outer end portions 100 accessible at the rear side 96. The inner end portions 98 of the terminals are arranged along a first straight line 101 (FIG. 10). The outer end portions 100 are arranged in parallel rows of six that are equally spaced laterally across a second straight line 103 (FIG. 11). The second straight line 103 lies in a plane parallel to the plane of the first straight line 101, but is skewed at an acute angle to the first straight line 101.

Figure 12:
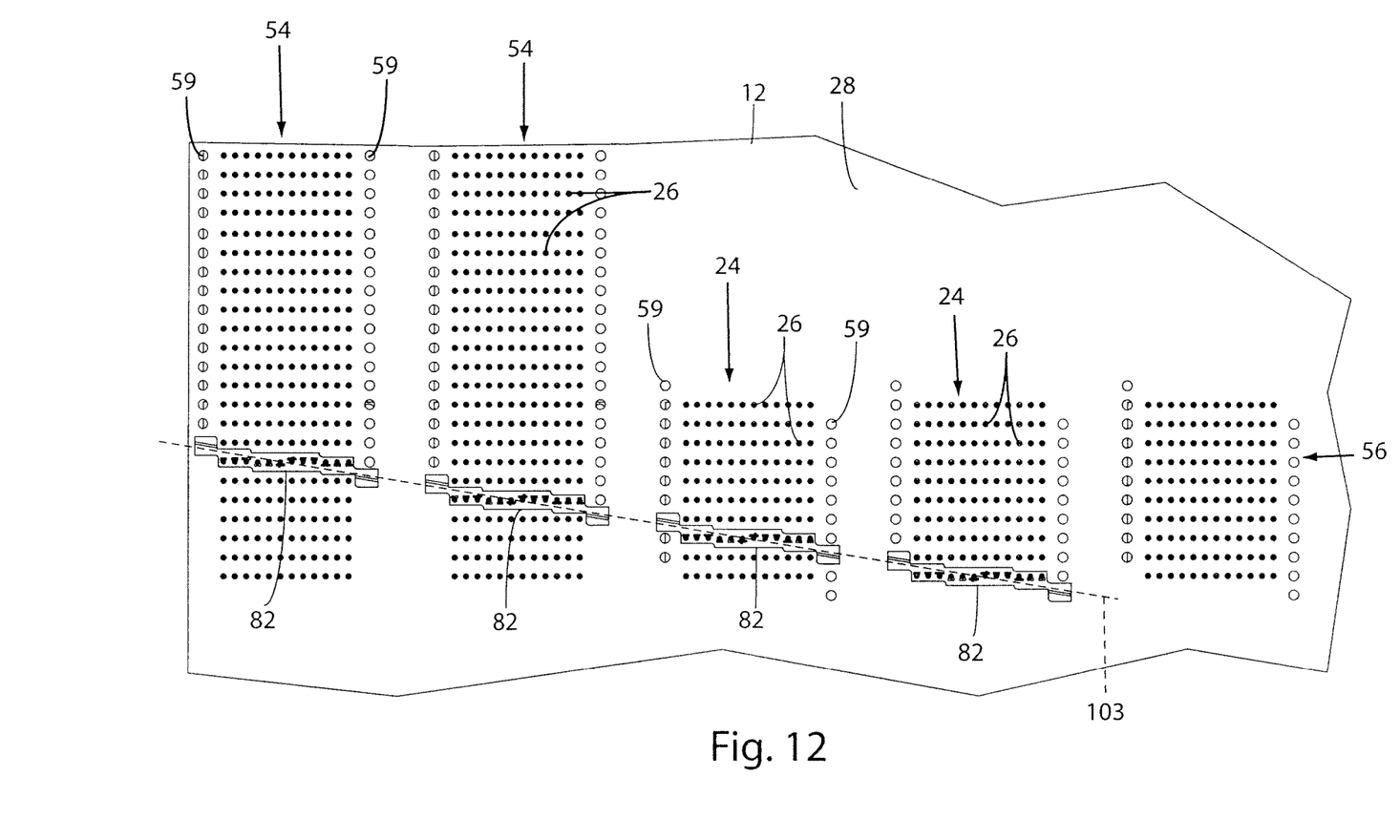
FIG. 12 is an enlarged partial view of parts of the backplane assembly.

Pegs 104 project from the housing 92 at opposite ends of the front side 94. The pegs 104 are receivable in peg holes 59 in the backplane 12 to support the adapter 82 in an installed position at the rear side 28 of the backplane 12. When in the installed position, the inner end portions 98 of the terminals 90 engage a row of pins 26 projecting from a row of pin holes 57 in the backplane 12. Accordingly, as shown in FIG. 12, the four adapters 82 can be installed on the rear side of the backplane 12 separately from each other, but with their skewed lines 103 extending together across multiple arrays 24 of pins 26. The inner end portions 98 of the terminals 90 then engage four diagonally offset rows of conductors 26 corresponding to four different cards 14 at the front side 16 of the backplane 12.

Figure 13:
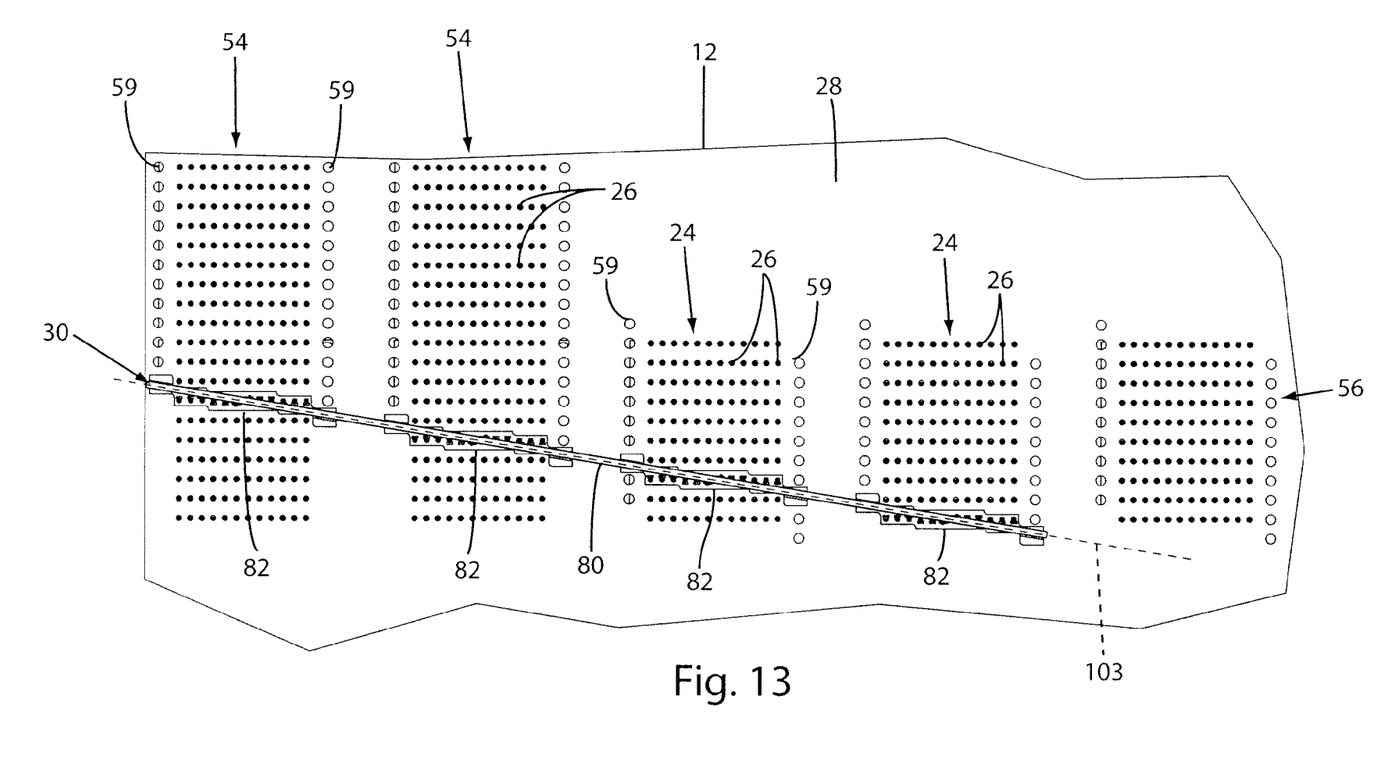
FIG. 13 is a view similar to FIG. 12, showing another part of the backplane assembly.
Figure 14:
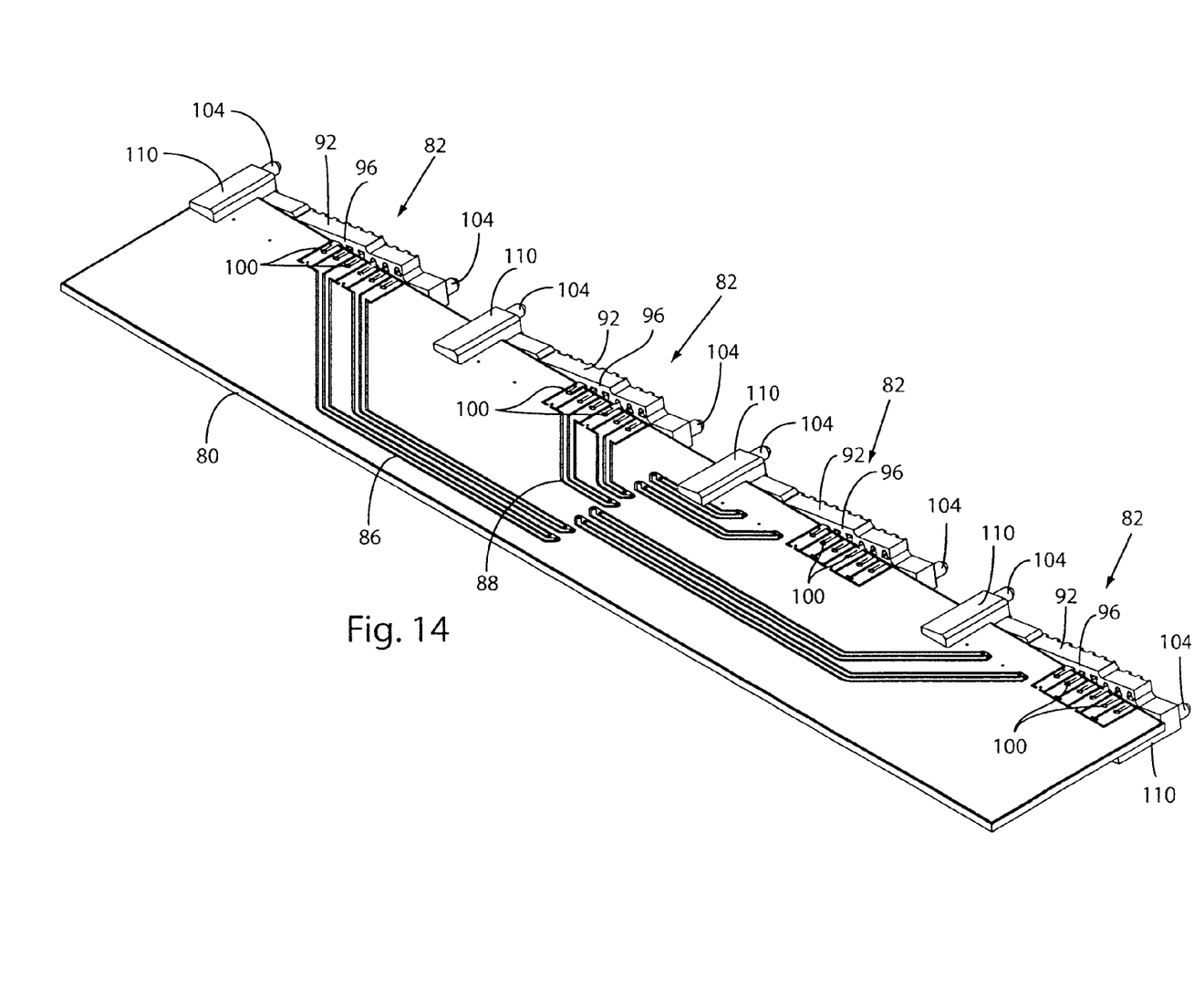
FIG. 14 is a rear perspective view of the backplane assembly, taken from above.
Figure 15:
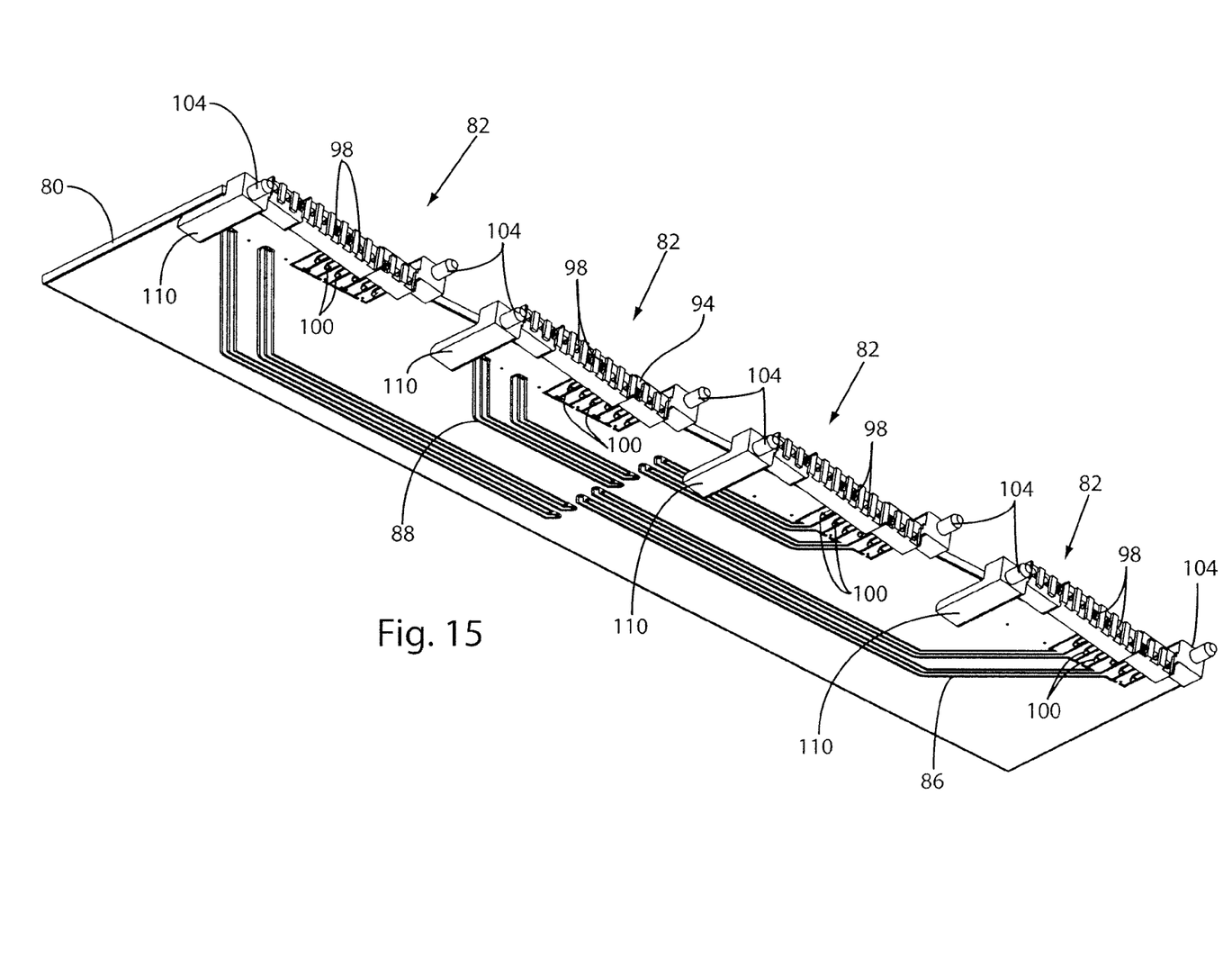
FIG. 15 is a front perspective view of the parts shown in FIG. 14, taken from below.

Each adapter 82 also has a pair of pillars 110 which project from the housing 92 at opposite ends of the rear side 96. The pillars 110 face oppositely across the skewed line 103 to define a slot 111 for receiving the connector board 80 along the skewed line 103, as shown in FIG. 13. When the connector board 80 is received in the slot 111, the outer end portions 100 of the terminals 90 engage a set of contacts 84 on the connector board 80. As best seen from above and below in FIGS. 14 and 15, the outer end portions 100 of the terminals 90 on one side of the skewed line 103 engage contacts 84 on one side of the connector board 80, and the outer end portions 100 on the other side of the skewed line 103 engage contacts 84 on the other side of the connector board 80. The four adapters 82 are thus configured to receive the connector board 80 in an installed position extending diagonally across the rear side 28 of the backplane 12 to bridge the adapters 82, and thereby to electrically interconnect the four corresponding cards 14 at the front side 16, as shown in FIG. 13.

Figure 16:
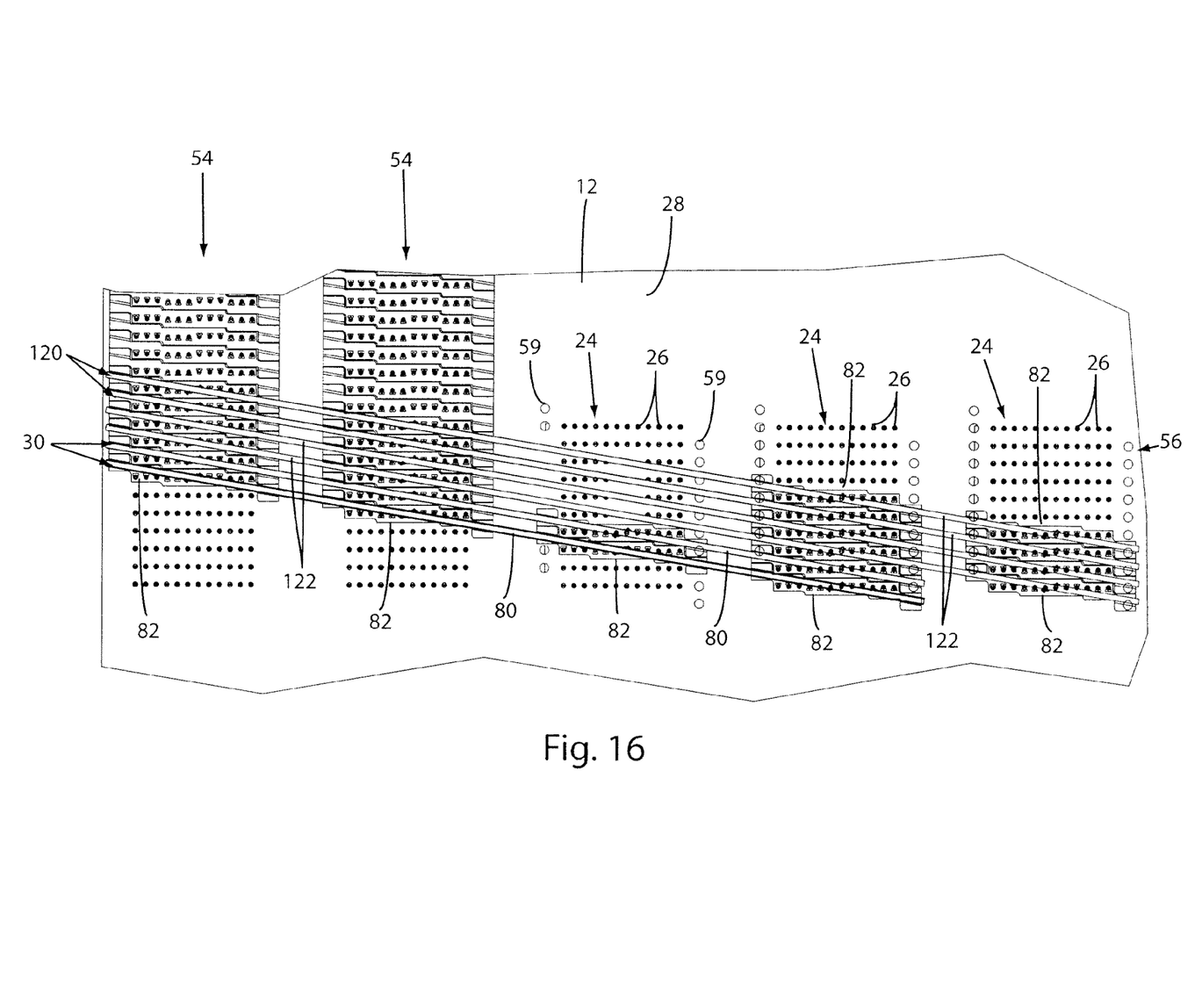
FIG. 16 is a rear perspective view showing additional parts of the backplane assembly.

Multiple connector board assemblies can be added as needed. For example, FIG. 16 shows the two hub cards 50 connected with the adjacent pair of daughter cards 52 by two of the connector board assemblies 30 described above. The hub cards 50 are connected to more remote pairs of daughter cards 52 by connector board assemblies 120 that differ only by having appropriately longer connector boards 122. Although each of these boards 80 and 122 has four sets of contacts 84 that are interconnected in two pairs for four corresponding arrays 24 of conductors 26, the number and interconnected arrangement of contact sets can differ as required by any particular specification or standard of backplane routing assignments. The arrangement of conductor holes in the backplane can differ accordingly. In each case, the connector board is preferably perpendicular to the backplane, as in the embodiments shown in the drawings.

Figure 17:
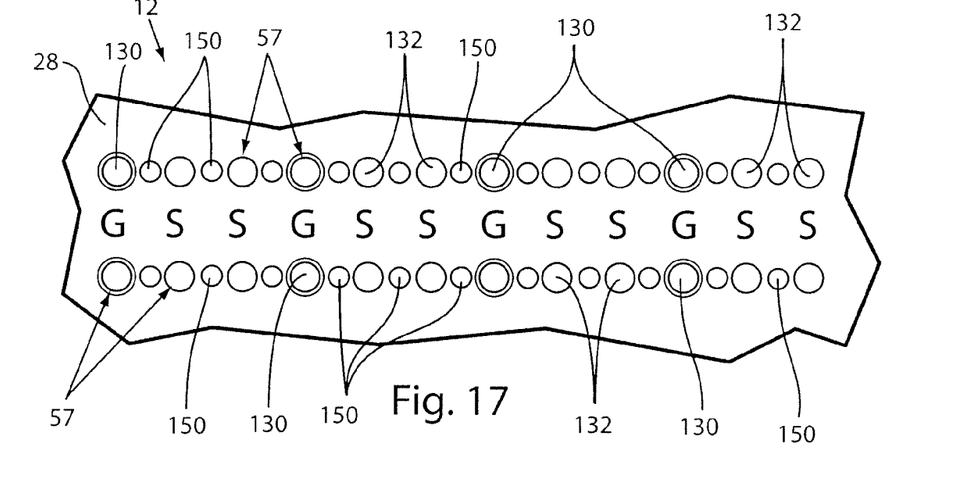
FIG. 17 is an enlarged partial view of a part of the backplane assembly.

Further regarding the structure of the backplane 12, FIG. 17 shows that a typical row of conductor holes 57 includes both ground holes 130 and signal holes 132. The row of conductors 26 received in those holes 130 and 132 includes ground pins 42, one of which is shown in FIG. 18, and signal pins 38, one of which also is shown in FIG. 18.

Figure 18:
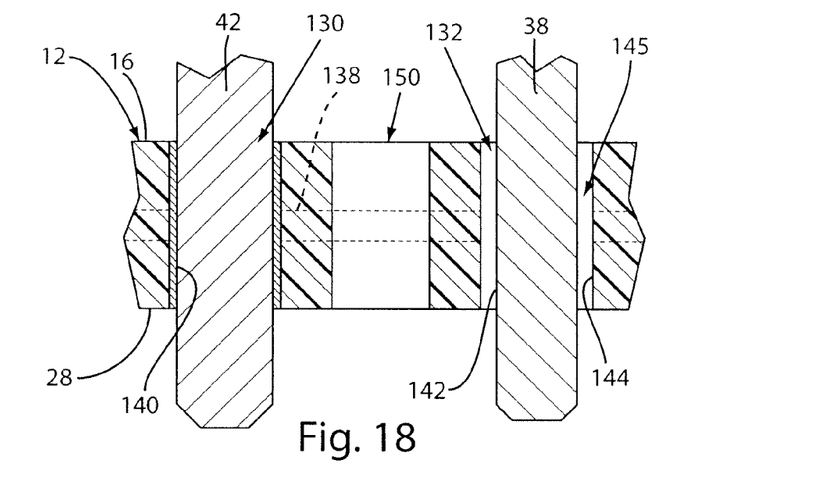
FIG. 18 is a partial sectional view of the part shown in FIG. 17.

The backplane 12 includes a ground plane 138 (FIG. 18). Each ground hole 130 has plating 140 that connects the respective ground pin 42 with the ground plane 138 in a known manner. The ground plane 138 could be at the surface of the backplane 12 or within the backplane 12 as shown, and the structure of the backplane 12 could include a solder mask and solder for completing the installation of the ground pins 134 in any suitable configuration known in the art. Those structural features of the backplane 12 are omitted from the drawings for clarity of illustration.

As described above, the signal connections between the cards 14 are routed through the connector board assemblies 30 and 120 instead of through the backplane 12. The structure of the backplane 12 is thus simplified by the absence of circuitry that interconnects the signal holes 132. This is illustrated in part in FIG. 18, which shows that each signal hole 132 in the preferred embodiment is not plated. FIG. 18 also shows that each signal hole 132 is preferably wide enough to provide clearance for the installed signal pin 38 to extend fully through the hole 132 free of contact with the backplane 12. With the signal pins 38 passing freely through the backplane 12 in this manner, the ground pins 42 engage the backplane 12 sufficiently to support the headers 22 (FIGS. 1 and 5) on the backplane 12.

More specifically, in the illustrated embodiment each signal hole 132 is a cylindrical passage with a uniform diameter. The section of the signal pin 38 that extends through the hole 132 has a square cross-section that is narrower than the hole 132. The pin 38 is centered within the hole 132 so that the entire peripheral surface 142 of the pin 38 is spaced radially from the surrounding inner surface 144 of the backplane 12 inside the hole 132. The space 145 between the pin 38 and the backplane 12 contains air that serves as a dielectric for increasing the impedance between this pin 38 and a pin in an adjacent signal hole 132. The level of impedance provided in this manner can be controlled by the dimensions of the space 145. Therefore, for any given material of which the backplane 12 is formed, predetermined levels of impedance can be provided by predetermined sizes of the signal holes 132 and signal pins 38.

Another impedance control feature is shown in FIGS. 17 and 18. This feature, which may be used either with the air spaces 145 or as an alternative to the air spaces 145, includes additional through holes 150. The additional through holes 150 could have other locations, but each is preferably located within a row of conductor holes 57 between a pair of adjacent holes 57 in the row. The absence of signal traces between the conductor holes 57 provides space for the additional through holes 150 at those locations. Like the signal holes 132, the additional through holes 150 are preferably not plated. They can be smaller than the signal holes 132 because they do not receive conductors, but their presence between adjacent conductor holes 57 interposes additional air spaces to provide predetermined levels of impedance in the same manner as the air spaces 145 in the signal holes 132.

Figure 19:
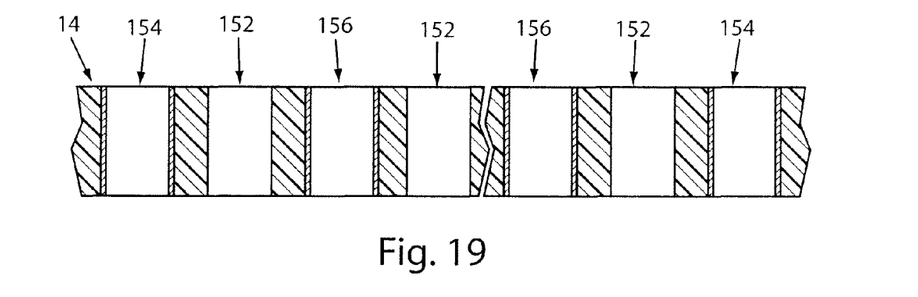
FIG. 19 is a partial sectional view of another part of a backplane assembly.

In addition to their use in the backplane 12, the unplated through holes 150 could be included in any circuit board that would benefit from the addition of impedance control that results. For example, FIG. 19 shows one of the cards 14 of FIG. 1 with unplated through holes 152. The unplated through holes 152 are arranged along a row of plated ground holes 154 and plated signal holes 156 for receiving the pins 158 on the connectors 20 (FIGS. 1 and 3). Like the unplated through holes 150 in the backplane 12, the unplated through holes 152 in the card 14 are configured to provide predetermined levels of impedance based on their size.

Figure 20:
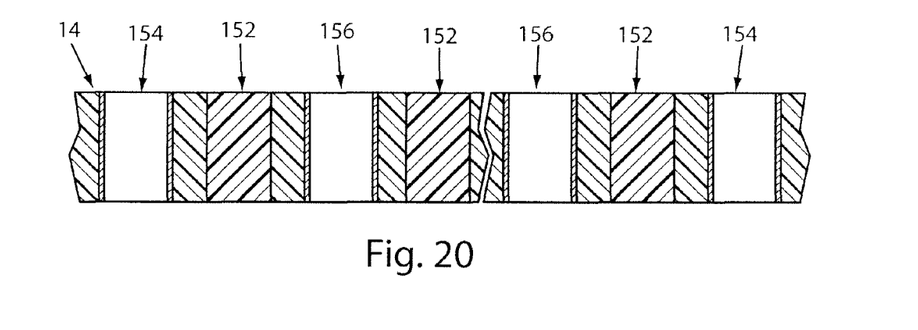
FIG. 20 is a view similar to FIG. 19, showing a different part of a backplane assembly.

Yet another impedance control feature is shown in FIG. 20. In this embodiment of the invention, a card 14 has unplated through holes 150 like those of FIG. 19, but these unplated through holes 150 are filled with Teflon, an epoxy filled with microspheres, or some other material that has the effect of altering the impedance by changing the dielectric constant. Any one or more of the unplated through holes 150 of FIGS. 17 and 18 could likewise be filled with such a dielectric material.

The patentable scope of the invention is defined by the claims, and may include other examples of how the invention can be made and used. Such other examples, which may be available either before or after the application filing date, are intended to be within the scope of the claims if they have structural or method elements that do not differ from the literal language of the claims, or if they have equivalent structural or method elements with insubstantial differences from the literal language of the claims.

What is claimed is:

1. An apparatus for interconnecting circuit boards through ground conductors and signal conductors connected to the circuit boards, the apparatus comprising:
   a backplane having a front side, a rear side, a ground plane, and conductor through holes for conductors to project through the backplane in arrays corresponding to respective circuit boards arranged along the front side of the backplane;
   the conductor through holes including a plurality of ground holes, each of which is sized to receive only a single ground conductor, with the single ground conductor in connection with the ground plane, and a plurality of signal holes, each of which is sized to receive only a single signal conductor, with the single signal conductor free of a connection with the ground plane;
   the backplane being free of circuitry that interconnects signal conductors in the plurality of signal holes.

2. The apparatus of claim 1 wherein each of the plurality of signal holes is wide enough to provide clearance for a signal conductor to extend fully through the signal hole free of contact with the backplane and thereby to provide an impedance control space between the signal conductor and the backplane.

3. The apparatus of claim 1, wherein the each of the plurality of signal holes is not plated.

4. The apparatus of claim 1, wherein the backplane further has a plurality of nonconductor through holes, each of which is located between a pair of adjacent conductor through holes.

5. The apparatus of claim 4, wherein each of the plurality of non-conductor through holes is not plated.

6. The apparatus of claim 4, wherein each of the plurality of non-conductor through holes is filled with dielectric material and does not contain a signal conductor or a ground conductor.

7. An apparatus for interconnecting circuit boards through ground conductors and signal conductors connected to the circuit boards, the apparatus comprising:
   a backplane having a front side, a rear side, a ground plane, and conductor through holes for conductors to project through the backplane in arrays corresponding to respective circuit boards arranged along the front side of the backplane;
   the conductor through holes including a plurality of ground holes, each of which is sized to receive only a single ground conductor, with the single ground conductor in connection with the ground plane, and a plurality of signal holes, each of which is sized to receive only a single signal conductor, with the single signal conductor free of a connection with the ground plane, with each of the plurality of signal holes being wide enough to provide clearance for a signal conductor to extend fully through the signal hole free of contact with the backplane and thereby to provide an impedance control space between the signal conductor and the backplane.

8. The apparatus of claim 7, wherein each of the plurality of signal holes is not plated.

9. The apparatus of claim 7, wherein the backplane further has a plurality of non-conductor through holes, each of which is located between a pair of adjacent conductor through holes.

10. The apparatus of claim 9, wherein each of the plurality of non-conductor through holes is not plated.

11. The apparatus of claim 9, wherein each of the plurality of non-conductor through holes is filled with dielectric material and does not contain a ground conductor or a signal conductor.

12. An apparatus for interconnecting circuit boards through ground conductors and signal conductors connected to the circuit boards, the apparatus comprising:
   a backplane having a front side, a rear side, a ground plane, and conductor through holes for conductors to project through the backplane in arrays corresponding to respective circuit boards arranged along the front side of the backplane;

the conductor through holes including a plurality of ground holes, each of which is sized to receive only a single ground conductor, with the single ground conductor in connection with the ground plane, and a plurality of signal holes, each of which is sized to receive only a single signal conductor, with the single signal conductor free of a connection with the ground plane;

the backplane further having a plurality of non-conductor through holes, each of which is located between a pair of adjacent conductor through holes.

13. The apparatus of claim 12, wherein each of the plurality of non-conductor through holes through holes is not plated.

14. The apparatus of claim 12, wherein each of the plurality of non-conductor through holes is filled with dielectric material and does not contain a ground conductor or a signal conductor.

15. The apparatus of claim 12, wherein each of the plurality of signal holes is not plated.

16. An apparatus for interconnecting circuit boards through ground conductors and signal conductors connected to the circuit boards, the apparatus comprising:

a backplane having a front side, a rear side, a ground plane, and conductor through holes for conductors to project through the backplane in arrays corresponding to respective circuit boards arranged along the front side of the backplane;

the conductor through holes including a plurality of ground holes, each of which is sized to receive only a single ground conductor, with the single ground conductor in connection with the ground plane, and a plurality of signal holes, each of which is sized to receive only a single signal conductor, with the single signal conductor free of a connection with the ground plane;

the backplane further having means for providing a predetermined level of impedance between a pair of signal conductors in a pair of adjacent signal holes.

17. The apparatus of claim 16 wherein the backplane is free of circuitry configured to interconnect signal conductors in the plurality of signal holes.

18. An apparatus for interconnecting circuit boards through ground conductors and signal conductors connected to the circuit boards, the apparatus comprising:

a board having conductor through holes for conductors to project through the board, the conductor through holes including a plurality of ground holes, each of which is sized to receive only a single ground conductor, and a plurality of signal holes, each of which is sized to receive only a single signal conductor;

the board further having and a plurality of non-conductor through holes, each of which is located between a pair of adjacent conductor through holes.

19. The apparatus of claim 18 wherein each of the plurality of non-conductor through holes is not plated.

20. The apparatus of claim 18 wherein each of the plurality of non-conductor through holes is filled with dielectric material and does not contain a ground conductor or a signal conductor.

21. The apparatus of claim 18 wherein the board is a backplane.

22. The apparatus of claim 18 wherein the board is a circuit board configured for connection with a backplane.

23. An apparatus for interconnecting circuit boards through ground conductors and signal conductors connected to the circuit boards, the apparatus comprising:

a board having conductor through holes for conductors to project through the board, the conductor through holes including a plurality of ground holes, each of which is sized to receive only a single ground conductor, and a plurality of signal holes, each of which is sized to receive only a single signal conductor;

the board further having means for providing a predetermined level of impedance between a pair of signal conductors in a pair of adjacent signal holes.

24. The apparatus of claim 23 wherein the board is a backplane.

25. The apparatus of claim 23 wherein the board is circuit board configured for connection with a backplane.

26. The apparatus of claim 4 wherein each of the plurality of non-conductor through holes is smaller than each of the plurality of signal holes.

27. The apparatus of claim 9 wherein each of the plurality of non-conductor through holes is smaller than each of the plurality of signal holes.

28. The apparatus of claim 12 wherein each of the plurality of non-conductor through holes is smaller than each of the plurality of signal holes.

29. The apparatus of claim 18 wherein each of the plurality of non-conductor through holes is smaller than each of the plurality of signal holes.

* * * * *